United States Patent
Riedel (10) Patent No.: US 9,668,364 B2
(45) Date of Patent: May 30, 2017

(54) DISPLAY DEVICE FOR AN AIRCRAFT

(71) Applicant: Airbus Operations GmbH, Hamburg (DE)

(72) Inventor: Christian Riedel, Bliedersdorf (DE)

(73) Assignee: Airbus Operations GmbH, Hamburg (DE)

( * ) Notice: Subject to any disclaimer, the term of this patent is extended or adjusted under 35 U.S.C. 154(b) by 0 days.

(21) Appl. No.: 14/529,661

(22) Filed: Oct. 31, 2014

(65) Prior Publication Data
US 2015/0131213 A1    May 14, 2015

(30) Foreign Application Priority Data
Oct. 31, 2013    (EP) .................................... 13191091

(51) Int. Cl.
*H05K 5/00*    (2006.01)
*G06F 1/16*    (2006.01)
*B64D 11/00*   (2006.01)
*H05K 5/02*    (2006.01)

(52) U.S. Cl.
CPC ....... *H05K 5/0017* (2013.01); *B64D 11/0015* (2013.01); *G06F 1/1601* (2013.01); *H05K 5/0226* (2013.01); *H05K 5/0247* (2013.01)

(58) Field of Classification Search
CPC .. H05K 5/0017; H05K 5/0226; H05K 5/0247; B64D 11/0015; G06F 1/1601
See application file for complete search history.

(56) References Cited

U.S. PATENT DOCUMENTS

| | | | |
|---|---|---|---|
| 6,200,160 B1 * | 3/2001 | Drexler ................ | G02B 6/3897 439/536 |
| 6,702,604 B1 * | 3/2004 | Moscovitch ........ | B60R 11/0235 248/121 |
| 6,935,883 B2 * | 8/2005 | Oddsen, Jr. .......... | H01R 13/625 248/274.1 |

(Continued)

FOREIGN PATENT DOCUMENTS

WO    WO 2008/014352    1/2008

OTHER PUBLICATIONS

European Search Report for Application No. 13 19 1091 dated Jan. 29, 2014.

*Primary Examiner* — Courtney Smith
*Assistant Examiner* — Keith Depew
(74) *Attorney, Agent, or Firm* — Jenkins, Wilson, Taylor & Hunt, P.A.

(57) ABSTRACT

A display device for an aircraft and an aircraft including such device. An exterior first surface forms a first side of the device, and an exterior second surface forms a second side. A display is arranged as at least a portion of the first surface and an electrical and/or data terminal is provided. The display and terminal are mounted on a housing arrangement. The second surface is a portion of the housing arrangement and includes an engagement portion extending planarly and so the device can be mounted to a planar wall of an aircraft with the engagement portion in contact with the wall. The second surface includes at least one recess, each terminal arranged completely in a recess where the respective terminal is facing in a direction transverse to a surface normal of the engagement portion. Each of the at least one recess is completely surrounded by the engagement portion.

12 Claims, 4 Drawing Sheets

(56) References Cited

U.S. PATENT DOCUMENTS

| | | | |
|---|---|---|---|
| 8,508,673 B2* | 8/2013 | Perlman | B64D 11/0015 348/837 |
| 8,740,301 B2* | 6/2014 | Liu | B60N 2/4876 297/217.1 |
| 2006/0288378 A1* | 12/2006 | Vitito | B60K 35/00 725/77 |
| 2010/0055966 A1* | 3/2010 | Sontag | B64D 43/00 439/374 |
| 2011/0126242 A1 | 5/2011 | Cline et al. | |
| 2011/0174926 A1* | 7/2011 | Margis | B60N 2/4876 244/118.6 |
| 2013/0094168 A1 | 4/2013 | Jaeger et al. | |

* cited by examiner

DISPLAY DEVICE FOR AN AIRCRAFT

TECHNICAL FIELD

The present application relates to a display device for an aircraft, the device comprising an exterior first surface forming a first side of the device, an exterior second surface forming a second side of the device opposite the first side, a display adapted for displaying images on a display surface which is arranged such that it constitutes at least a portion of the first surface, at least one electrical and/or data terminal for connection to a mating connector of cable, and a housing arrangement to which the display and the at least one terminal are mounted, and to an aircraft comprising such a device.

BACKGROUND

In aircraft various display devices are provided for displaying images and information. Some of these devices also include an input for inputting information to the device. In addition to flat panel screen devices provided as parts of the inflight entertainment system for displaying movies and information to passengers, examples of such devices include flight attendant panels, which may comprise a touch screen as an input and which are mounted in the aircraft cabin such that they are accessible to the flight attendants. The flight attendants panels are adapted for displaying status information to the flight attendants and for allowing the flight attendants to enter control commands for controlling various on-board equipment, such as the flight entertainment system, the air conditioning system, the lighting system and the audio system.

Due to aircraft safety regulations it is important that such display devices are securely mounted in the aircraft. In particular for flight attendant panels, which fulfill functions relevant to the safety of the operation of the aircraft, it is further important that the risk of unauthorized manipulation, e.g. by passengers, is reduced as much as possible. These requirements necessitate, amongst others, that the display devices are mounted to a wall portion of the aircraft over their entire backside facing the wall portion such that the backside provides at its edge an annularly closed circumferential contact region abutting the wall portion.

When constructing and mounting display devices for aircraft it is important to take into consideration the cabling necessary for coupling electricity and data signals to and from the devices and the space available in the aircraft. For example, flight attendant panels are typically mounted to monument or lavatory walls in door areas of the aircraft in the immediate vicinity of the cabin attendant seats in which the cabin attendants are seated during take-off and landing. The cabling is provided by cables having connectors connected to corresponding mating terminals which are typically arranged at the laterals sides of the flight attendant panel housing. Arranging the terminals at the upper side of the flight attendant panel housing is not allowable because of limited protection against entry of liquids into the connectors, and arranging the terminals at the bottom side of the flight attendant panel housing is disadvantageous because the cabling would then occupy space required for the cabin attendant seats and other cabin equipment. The cables are guided away from the flight attendant panel and are secured to the wall portion by suitable fixing structure which, due to safety requirements, have to be constructed such that the cables are extending spaced from the surface of the wall portion. In order to impede manipulation, a cover is provided for covering the cabling.

Due to the severely limited space inside the aircraft cabin the space requirements of the devices, including the necessary cabling, must be kept as low as possible.

SUMMARY

It is an object of the present disclosure to provide a display device for an aircraft which is adapted to provide for particularly small additional space requirements for the cabling.

The display device for an aircraft, which display device can be a flat panel display device, comprises an exterior first surface forming a first side of the device and an exterior second surface forming a second side of the device opposite the first side. Consequently, the first and second sides each constitute a portion of the exterior of the device. As will become apparent in the following, in the condition in which the device is mounted to a wall of the aircraft, the first side is the front side of the device facing away from the wall and the second side is the back side of the device facing towards the wall.

The device further comprises a display which is adapted for displaying images on a display surface of the display and, thus, of the device. The display surface, which can in one aspect be rectangular, can be arranged in such a manner that it constitutes at least a portion of the first surface. It is to be noted that for typical display the display surface will be an outer cover and in particular an outer glass cover forming part of the display.

Moreover, the device comprises at least one electrical and/or data terminal for connection to a suitable mating connector of a cable, and a housing arrangement to or in which the display and the at least one terminal, as well as other components of the device, are mounted. The terminals are adapted for feeding, via respective cables, connectors of the cables and the terminals subsequent to connecting the connectors of the cables to the terminals, electricity and data to and from the device and are suitably connected to corresponding components disposed inside the housing arrangement, such as a power supply unit, one or more control units and/or one or more data processing units. The cables and connectors constitute the (external) cabling necessary for operating the device.

The second surface is a portion of the housing arrangement, more particularly of the exterior surface of thereof, and comprises an engagement portion extending in a plane and being arranged such that the device can be mounted to a planar wall of an aircraft with the engagement portion in contact with the wall. In other words, the engagement portion is itself a surface which is a portion of the second surface and, thus, a portion of the exterior surface of the housing arrangement, and the engagement portion further constitutes the rearwardmost portion of the housing arrangement and of the device as a whole when mounted to a planar wall with the first side facing away from the wall and the second side facing towards the wall. In this mounted condition the engagement portion is in contact with the wall over the entire extension of the engagement portion.

The second surface comprises at least one recess or depression, i.e. a relatively shallow and extended, bottoming hole. In other words, the at least one recess is provided in the second surface and the side and bottom walls defining the recess define portions of the second surface.

Each of the at least one terminal is arranged completely in one of the at least one recess. Thus, the respective terminal does not project from the respective recess, i.e. does not project from inside the recess beyond the plane in which the engagement portion extends, so that the terminal is disposed entirely inside the contour defined by the housing arrangement. Further, each of the at least one terminal is arranged in such a manner that it is facing or oriented in a direction transverse and can be perpendicular to a surface normal of the engagement portion. In the usual manner, in the present application the direction in which a terminal is facing or oriented is understood as the direction in which a mating connector is moved when disconnecting it from the terminal, i.e. the direction opposite to the plug-in direction in one aspect of the terminal and the mating connector forming a plug and socket connection. The direction is defined by the construction of the contact arrangement of the terminal. It will be appreciated that if the direction in which a terminal is facing is perpendicular to a surface normal of the engagement portion, the terminal is facing in a direction parallel to the plane in which the engagement portion extends. In any case, each recess can comprise a sidewall extending perpendicularly to the engagement portion and a bottom wall extending parallel to the engagement portion, and each terminal disposed in the respective recess is mounted in or to the sidewall such that the direction in which the terminal is facing is perpendicular to the respective sidewall.

Finally, each of the at least one recess is completely surrounded by the engagement portion. In other words, the recesses are formed in the engagement portion of the second surface, so that the upper circumferential edge of the recesses is formed by an annularly closed portion of the engagement portion. Consequently, when the engagement portion is brought into contact with a planar wall, each of the at least one recess is hidden from external access.

The above construction provides the advantage that the space requirements for the cabling can be considerably lowered, because the terminals as well as the connectors and at least a portion of the cables of the cabling can be disposed entirely inside the recesses and, thus, within the device contour, and the device can be mounted in direct contact to a wall. For this reason it is also possible to dispense with an external cover at least for covering the terminals and connectors and to provide fixing structure for a part of the routing of the cables inside the recesses, thereby lowering weight and complexity and facilitating installation without scarifying protection against entry of liquids into the terminals. Moreover, the safety is enhanced, because access to the terminals and connectors is prevented by the device itself and its mounting to the wall, and for the same reason the terminals and any connectors of cables connected to the terminals are protected from all kinds of detrimental environmental conditions, such as liquid, sand, etc. Also, an additional shielding for an enhancement of the EMC characteristics of the cable connectors is provided.

In one aspect, the device can be of rectangular shape, i.e. has the shape or essentially the shape of a rectangular cuboid. Then, the first and second surfaces are two opposite surfaces of the rectangular device, which opposite surfaces can be the two surfaces which are larger than the remaining four lateral surfaces.

In one aspect, the first surface or at least the display surface extends in a plane which is parallel to the plane in which the engagement portion extends. This is particularly the case for a device having a rectangular shape as described above.

In one aspect the device is a flight attendant panel fulfilling the functions generally mentioned above.

In one aspect the housing arrangement comprises a circumferential sidewall arrangement extending between the first and second surfaces. In this regard it is to be noted that a part and in particular an outer edge part of the first and second surface can be formed by the sidewall arrangement, in particular by end surfaces of the sidewall arrangement. In this embodiment at least one cable penetration opening or bore can be provided in and through the sidewall arrangement and can be in communication with at least one of the at least one recess. Each such cable penetration opening is arranged such that a cable of suitable dimensions can extend through the respective cable penetration opening—and a possible cable duct disposed adjacent the actual cable penetration opening—between the interior of the respective recess and the exterior of the device. In this manner a portion of the cables of the cabling can be routed outside the device, whereas the connectors and the remainder of the cables are disposed inside the device, thereby lowering space requirements and facilitating routing of the cables as explained above.

In one aspect, the engagement portion extends to the edge of the second surface along the entire circumference thereof. Consequently, the engagement portion includes a circumferential and annularly closed edge portion forming the outer circumferential edge or border of the second side of the device. Due to this construction unauthorized manipulation and in particular unauthorized and forcible removal of the device is further impeded.

In one aspect, the device is adapted to display, in operation on the display surface, images in a predetermined orientation defining a horizontal direction, a vertical direction, an upper end, a lower end and lateral sides of the device. It is to be noted that this does not exclude that the device may also be adapted to display images in other orientations, for example by operating a switch. The predetermined orientation referred to above defines an intended image display orientation and, thus, an intended mounting orientation of the device. In any case, for each of the at least one terminal the direction in which the respective terminal is facing is inclined or angled downwardly with respect to the horizontal direction of the device, and may e.g. be facing vertically downwardly, i.e. be oriented at an angle of 90° with respect to the horizontal direction. In other words, the angle between the direction of orientation of the respective terminal and the vertical direction is smaller than 90° when the 0° orientation is defined as the orientation in which the terminal is facing vertically downwards. Due to this arrangement the terminals are facing downwardly thereby facilitating preventing of entry of liquid into the terminals once the cabling is installed. In operation in the mounted condition of the device there is the risk of condensation water and other liquids flowing along the outer surfaces of the cables and being guided towards the terminals and connectors. Therefore, it is generally required to route the cables such that they form a loop immediately prior to their connector, which loop has a bent region disposed vertically below the terminal for allowing water to safely drop off the cable. The formation and arrangement of these so-called drip loops is simplified if the terminals are arranged in the above manner.

In this embodiment, for each of the at least one terminal, the direction in which the respective terminal is facing can be inclined or angled downwardly with respect to the horizontal direction of the device by 15° to 45°, preferably 15° to 35°, more preferably 15° to 30°, and even more preferably 15° to 25°, i.e. if the angle between the direction of orientation of the respective terminal and the horizontal direction has a value from the above ranges. For example, the angle between the horizontal direction of the device and the direction in which the respective terminal is facing may advantageously be about 15°, about 20° or about 25°. It has been found that such an arrangement, in which the angle is considerably smaller than 90°, is able to provide sufficient protection against entry of water while at the same time simplifying the routing of the cables inside the recesses. As will be explained further below, a vertical extension of the cables inside the recesses is advantageous.

In each of these embodiments at least one of the at least one recess can comprise a lateral wall or sidewall, which can extend perpendicularly to the plane in which the engagement portion extends and in which at least two of the terminals are provided one above the other with respect to the vertical direction of the device. Each of these at least two terminals is provided in a first lateral wall section—i.e. a section of the lateral wall—with the respective terminal facing perpendicularly with respect to the respective first lateral wall section. A second lateral wall section—i.e. another section of the lateral wall—is located, possibly together with other lateral wall sections, between each of the first lateral wall sections. Each of the first lateral wall sections is inclined at an angle of 15° to 45°, preferably 15° to 35°, more preferably 15° to 30°, and even more preferably 15° to 25° and for example about 15°, 20° or 5° (i.e. an angle from one of the ranges indicated above for the facing direction of the terminals) with respect to the vertical direction of the device to form an overhang region, and each of the second lateral wall sections is extending, for example horizontally, into the recess beyond the horizontal position of the upper end of the upper one of the two first lateral wall sections between which the respective second lateral wall section is located. Due to this arrangement of the second lateral wall sections, the terminals are further protected from liquid dripping of the terminals, connectors and cables located above them. Each of the second lateral wall sections can extend into the recess beyond the inwardmost horizontal position of the connector—and a possible drip loop—of a cable adapted for us with the device and for connection to the terminal immediately above the respective second lateral wall section if the connector is connected to the terminal.

In one aspect, the device further comprises at least one cable having a connector adapted to be releasably connected to and mate with one of the at least one terminal, wherein the connector, the respective terminal and the respective cable are adapted and arranged such that in connected condition of the terminal and the connector the cable can be arranged or routed such that the connector and the cable do not extend from the respective recess, i.e. beyond the plane in which the engagement portion extends. The connector of each of the at least one cable can be an angular connector, preferably a 90-degree connector. The use of an angular connector makes it possible to advantageously avoid having to provide for a drip loop. Due to a minimum bending radius of the cable which must be maintained drip loops consume a lot of space, which may not even be available inside the recesses.

When combining the above embodiments with first and second lateral wall sections of the recesses and the above embodiments with angular connectors, the device can also comprise fixing structure arranged and adapted for fixing the cables such that they extend upwardly from the corresponding terminal. In particular a cable penetration opening of the above construction may be located above the corresponding terminal or above all of the terminals.

The device may be advantageously utilized in an aircraft, thereby providing an aircraft comprising a planar wall portion and a device of the above configuration mounted to the wall portion in such a manner that the second side of the device is facing the wall portion and the first side is facing away from the wall portion. For at least one of the at least one recess, a bore can be provided in the wall portion, which bore is aligned with the respective recess and through which bore a least one of the at least one cable is guided out of the recess and into the wall portion. In this manner cable penetration openings in the housing arrangement can be prevented and the space requirements of the cabling are minimized.

BRIEF DESCRIPTION OF THE DRAWINGS

In the following an exemplary embodiment of the device will be explained in more detail with reference to the drawings.

DETAILED DESCRIPTION

Figure 1:
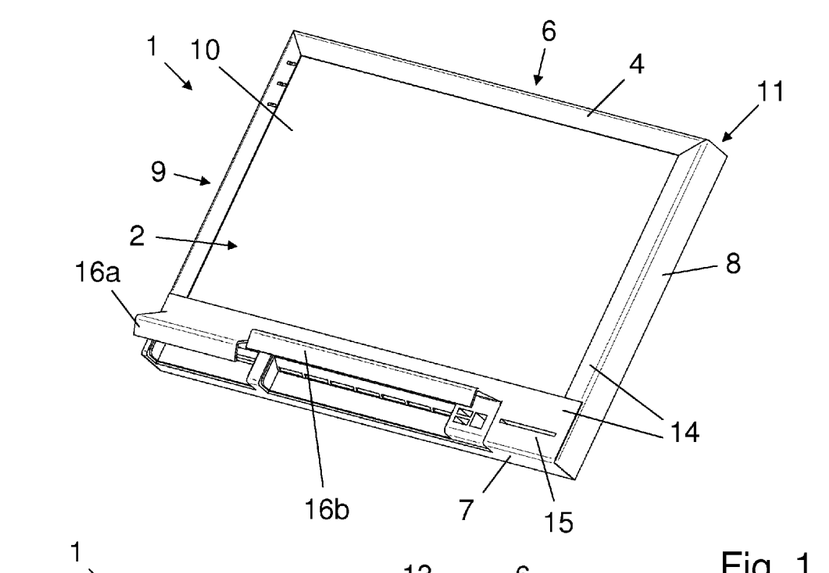
FIG. 1 shows a schematic perspective front view of a display device according to an embodiment of the present disclosure.
Figure 2:
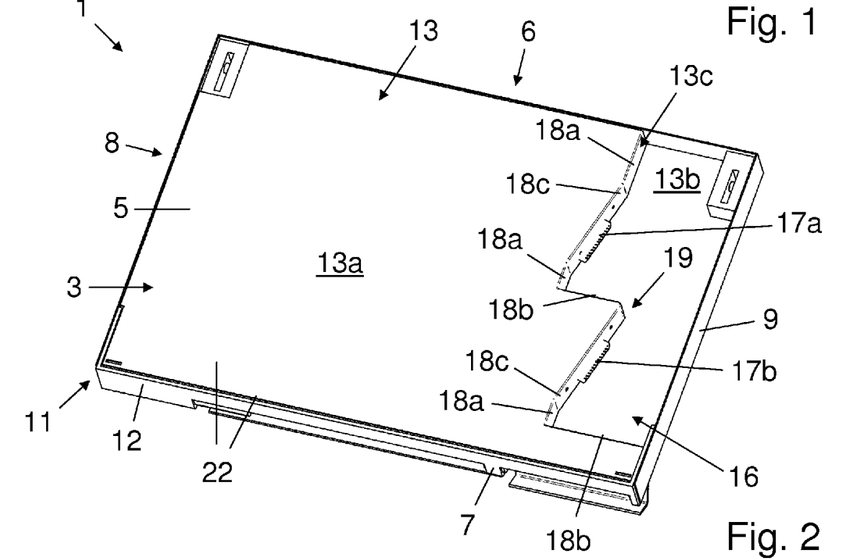
FIG. 2 shows a schematic perspective rearward view of the display device of FIG. 1.

The display device 1 shown in FIGS. 1 and 2, which device is a flight attendant panel, comprises a front side 2 and a backside 3, presenting over their entire extension a front surface 4 and a rearward surface 5, respectively, as well as an upper side 6, a lower side 7, a left hand side 8 and a right hand side 9. As can be seen in the Figures, the device 1 has generally the shape of a rectangular cuboid.

The terms designating a direction or orientation are used in the present application with reference to the intended mounting and operating position of the device 1 in which it is secured to a planar wall with the upper side 6 facing vertically upwardly, the lower side 7 facing vertically downwardly, the backside 3 facing towards and extending parallel to the wall, and the front side 2 facing away from the wall. The mounting position and the orientation are determined by the orientation of the images which are displayed on the rectangular screen portion 10, which occupies a large portion of the front surface 4 of the device 1.

The screen portion 10 of the front surface 4 is a part of a glass covering of flat panel display, such as an LCD display, which may also comprise a touch screen input. The flat panel display is secured into a housing 11 of the device 1, which housing comprises an annularly closed rectangular frame portion 12 forming the upper side 6, the lower side 7, the left hand side 8 and the right hand side 9, a back plate portion 13 providing the majority of the rearward surface 5, and a front portion 14. It is to be understood that each of the portions 12, 13 and 14 may be integrally formed in one piece or may be composed of several elements secured together. Further, some or all of the portions 12, 13 and 14 may be formed integrally in one piece or may be separate elements.

In the illustrated embodiment the front portion 14 of the housing 11 provides a rectangular bezel for the screen portion 10, wherein the lower section 15 of the rectangular front portion 14 is broader than the remaining sections and includes two hinged doors 16a, 16b below which control elements (not shown) may be arranged.

As can be seen in FIG. 2, the rearward surface 5 of the device 1 is constituted to a small part by end surfaces of walls of the rectangular frame portion 12. The remainder of the rearward surface is provided by the back plate portion 13, which secured to the rectangular frame portion 12. The back plate portion 13 which, in the illustrated embodiment, is integrally formed in one piece comprises a first, raised section 13a and a second, recessed section 13b. Both the raised section 13a and the recessed section 13b are planar and extend in planes parallel to the plane defined by the screen portion 10, but the raised section 13a is spaced further from the screen portion 10 than the recessed section 13b. The raised section 13a forms the rearwardmost portion of the device 1 and is extending at the level of the rearwardmost edge of the rectangular frame portion 12. Between the raised section 13a and the recessed section 13b a sidewall section 13c is disposed which extends perpendicularly to and between the raised section 13a and the recessed section 13b. As can be seen in FIG. 2, the recesses section 13b, the sidewall section 13c and a section of the rectangular frame portion 12 form a recess 16 in the rearward surface 5 of the device 1.

In the sidewall section 13c—and between the planes in which the raised section 13a and the recessed section 13b extend—two electrical and data terminals 17a, 17b are mounted in such a manner that they are facing in a direction perpendicular to the extension of the sidewall section 13c in the region in which they are mounted. As already noted above, the facing direction of the terminals 17a, 17b is identical to the direction in which a mating connector of a cable must be moved in order to disconnect it from the respective terminal 17a, 17b. Consequently, the terminals 17a, 17b are located inside the recess 16 and do not project from the recess 16, i.e. beyond the plane defined by the raised section 13a.

The sidewall section 13c of the back plate portion 13 can comprise three vertical sections 18a, which extend in the vertical direction, two horizontal sections 18b, which extend in the horizontal direction, and two inclined sections 18c, which extend at an angle of about 15° to 25° with respect to the vertical direction in such a manner as to form overhanging regions. The terminals 17a, 17b are each mounted in another one of the inclined sections 18c. Therefore, the terminals 17a, 17b are facing downwardly at an angle of about 15° to 25° with respect to the horizontal direction. This orientation contributes in preventing entry of liquid into the terminals.

One of the horizontal sections 18b is provided—together with one of the vertical sections 18a—between the two inclined sections 18c, and it extends well beyond the horizontal position of the upper end of the upper one of the two inclined sections 18c, thereby forming a step 19 which serves to protect the terminal 17b from liquid possibly dripping downwardly from a cable coupled with its connector to the terminal 17a.

Figure 3:
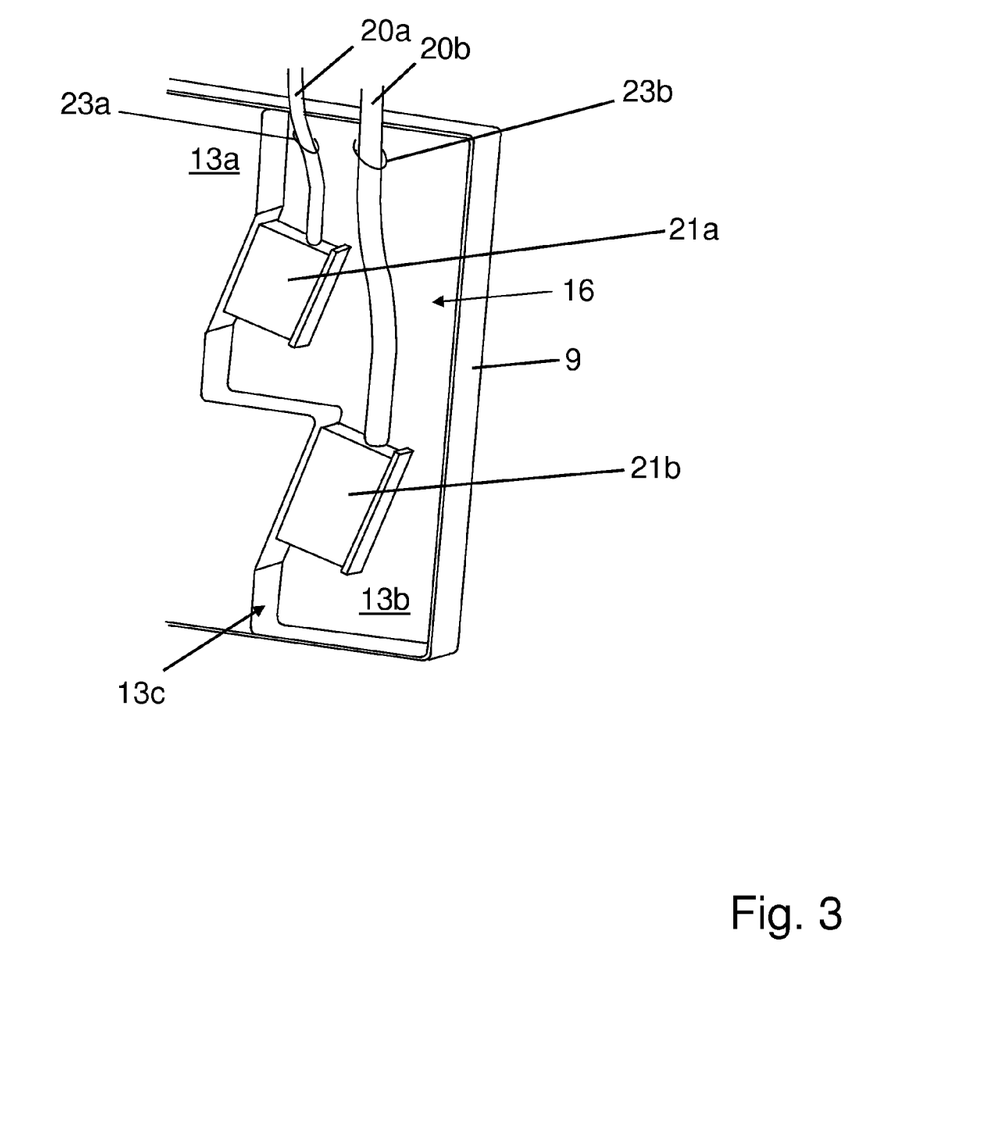
FIG. 3 shows a perspective rearward view of a portion of the device of FIGS. 1 and 2 with cabling being installed.

FIG. 3 shows a rearward view of a portion of the device 1 including the recess 16, wherein two cables 20a, 20b having respective connectors 21a, 21b are connected by the connectors 21a, 21b to the terminals 17a, 17b. As can be seen in FIG. 3, each of the connectors 21a, 21b is an angular connector, i.e. the direction into which the connector 21a, 21b is moved when connecting it to the corresponding terminal 17a, 17b is at an angle, and e.g. perpendicular, to the direction in which the cable extends adjacent to the connector 21a, 21b. The cables 20a, 20b are guided vertically upwardly away from the connectors 21a, 21b.

Advantageously, due to the use of the angular connectors 21a, 21b no drip loops have to be provided for the cables 20a, 20b, because liquid flowing down the cables 20a, 20b would drip off the lowest point of the connectors 21a, 21b without coming near the interface between the connectors 21a, 21b and the terminals 17a, 17b. This is further ensured by the downwardly inclined orientation of the terminals 17a, 17b.

Not only the terminals 17a, 17b, but the entire cabling including the connectors 21a, 21b and the adjacent portions of the cables 20a, 20b are located inside the recess 16 and do not project from the recess 16, i.e. beyond the plane defined by the raised section 13a. Therefore, it is possible to mount the device 1 to a planar wall with the raised section 13a of the back plate portion 13 and the end surfaces of walls of the rectangular frame portion 12 constituting a small part of the rearward surface 5 in contact with the planar wall. This portion in contact with the planar wall constitutes an engagement portion 22 of the rearward surface 5, which engagement portion completely surrounds the recess 16. Consequently, in the mounted condition the outer circumferential edge of the rearward surface is in contact with the planar wall to which the device 1 is mounted, so that unauthorized removal or manipulation of the device 1 and the cabling is prevented. The cabling including the terminals 17a, 17b, the connectors 21a, 21b and the cables 20a, 20b is shielded from unauthorized access and detrimental environmental conditions by the device 1—and the planar wall—itself, without the need of additional cover elements. Therefore, the routing of the cables 20a, 20b is simplified and the space requirements are reduced.

As schematically indicated by reference numerals 23a, 23b, the cables 20a, 20b are guided out of the recess 16 through bores 23a, 23b provided in the wall portion (not otherwise shown in FIG. 3) to which the device 1 is mounted. In this manner, no bores must be provided for this purpose in the device 1 itself, and the routing of the cabling is further simplified in that no external cover elements must be provided for the portion of the cables extending outside the device 1 and space restrictions present inside the cabin are circumvented.

Figure 4A:
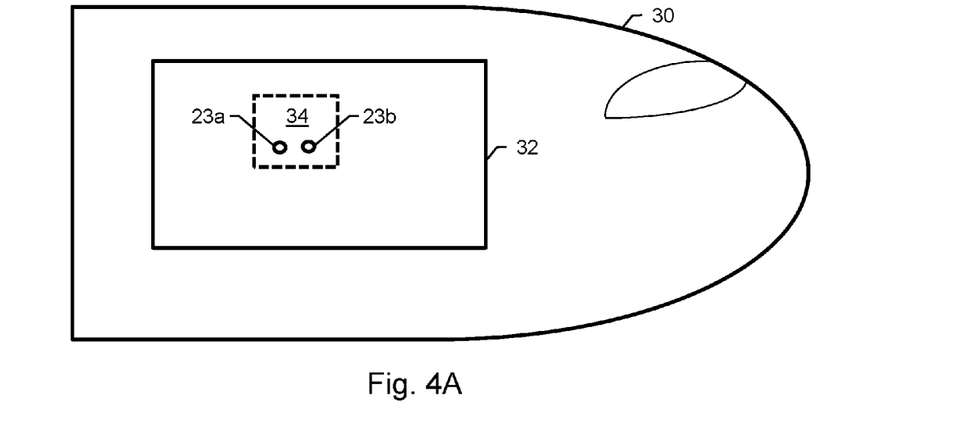
FIG. 4A shows an aircraft and a planar wall.
Figure 4B:
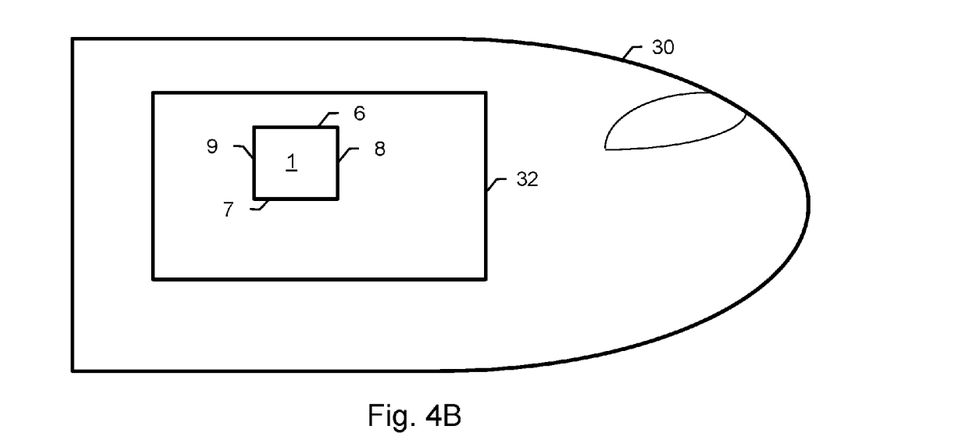
FIG. 4B shows the display device of FIG. 1 mounted on a portion of the planar wall.
Figure 4C:
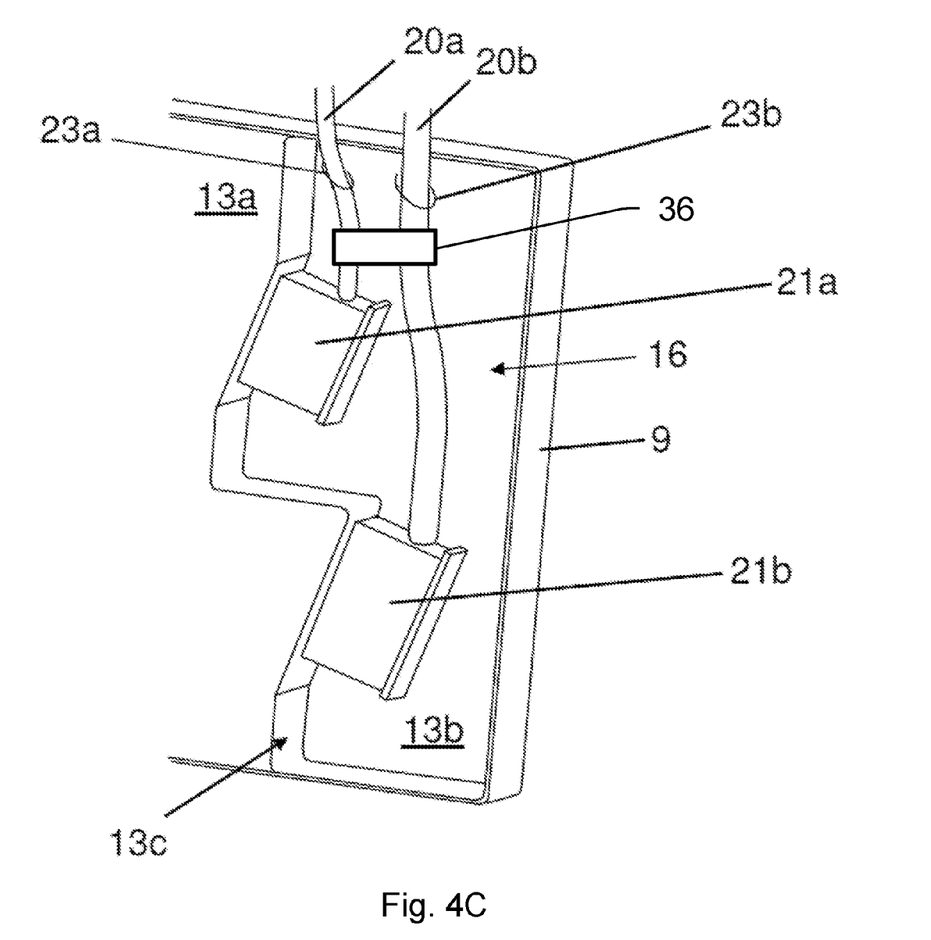
FIG. 4C shows fixing structure for fixing cables such that they extend upwardly.

FIG. 4A shows an aircraft 30 and a planar wall 32. The planar wall 32 includes a wall portion 34 for mounting the display device of FIG. 1. Bores 23a and 23b are provided in the wall portion 34 for guiding cables 20a, 20b as illustrated in FIG. 3. FIG. 4B shows the display device 1 of FIG. 1 mounted on the planar wall 32. FIG. 4C shows a rearward view of a portion of the device 1 illustrating fixing structure 36 arranged and adapted for fixing the cables such that they extend upwardly.

The invention claimed is:

1. A display device for an aircraft, the device comprising: an exterior first surface forming a first side of the device; an exterior second surface forming a second side of the device opposite the first side; a display adapted for displaying images on a display surface which is arranged such that it constitutes at least a portion of the first surface; at least one electrical and/or data terminal for connection to a mating connector of a cable; and a housing arrangement to which the display and the at least one terminal are mounted; wherein the second surface is a portion of the housing arrangement and comprises an engagement portion extending in a plane and being arranged such that the device can be mounted to a planar wall of the aircraft with the engagement portion in contact with the wall; wherein the second surface comprises at least one recess, wherein each of the at least one terminal is arranged completely in one of the at least one recess in such a manner that the respective terminal is facing in a direction transverse to a surface normal of the engagement portion, and wherein each of the at least one recess is completely surrounded by the engagement portion, wherein the device is adapted to display, in operation on the display surface, images in a predetermined orientation defining a horizontal direction, a vertical direction, an upper end, a lower end and lateral sides of the device, wherein for each of the at least one terminal the direction in which the respective terminal is facing is inclined downwardly with respect to the horizontal direction of the device; and wherein at least one of the at least one recess comprises a lateral wall in which at least two of the terminals are provided one above the other with respect to the vertical direction of the device, wherein

- each of the at least two terminals is provided in a separate first lateral wall section with the respective terminal facing perpendicularly with respect to the respective first lateral wall section, and
- a second lateral wall section is located between each of the first lateral wall sections, and wherein
- each of the first lateral wall sections is inclined at an angle of 15° to 45° with respect to the vertical direction of the device to form an overhang region, and
- each of the second lateral wall sections is extending into the recess beyond the horizontal position of the upper end of the upper one of the two first lateral wall sections between which the respective second lateral wall section is located.

2. The device according to claim 1, wherein the device is of rectangular shape.

3. The device according to claim 1, wherein the first surface or at least the display surface extends in a plane which is parallel to the plane in which the engagement portion extends.

4. The device according to claim 1, wherein the device comprises a flight attendant panel.

5. The device according to claim 1, wherein the housing arrangement comprises a circumferential sidewall arrangement extending between the first and second surfaces and at least one cable penetration opening is provided in the sidewall arrangement and is in communication with at least one of the at least one recess such that a cable can extend through the respective cable penetration opening between the interior of the respective recess and the exterior of the device.

6. The device according to claim 1, wherein the engagement portion extends to the edge of the second surface along the entire circumference thereof.

7. The device according to claim 1, wherein the at least one terminal is facing in a direction perpendicular to the surface normal of the engagement portion.

8. The device according to claim 1, wherein for each of the at least one terminal the direction in which the respective terminal is facing is inclined downwardly with respect to the horizontal direction of the device by 15° to 45°.

9. The device according to claim 1, further comprising at least one cable having a connector adapted to be releasably connected to one of the at least one terminal, wherein the connector and the respective terminal are adapted and arranged such that in their connected condition the cable can be arranged such that the connector and the cable do not extend from the respective recess.

10. The device according to claim 9, wherein the connector of each of the at least one cable is an angular connector.

11. The device according to claim 10, further comprising a fixing structure arranged and adapted for fixing the cables such that they extend upwardly from the corresponding terminal.

12. An aircraft comprising a wall portion and a device according to claim 9 mounted to the wall portion such that the second side of the device is facing the wall portion and the first side is facing away from the wall portion, wherein for at least one of the at least one recess a bore is provided in the wall portion, which bore is aligned with the respective recess and through which bore at least one of the at least one cable is guided out of the recess and into the wall portion.

* * * * *